US006992547B2

(12) United States Patent
Bergmann

(10) Patent No.: US 6,992,547 B2
(45) Date of Patent: Jan. 31, 2006

(54) SURFACE ACOUSTIC WAVE ARRANGEMENT FOR BROADBAND SIGNAL TRANSMISSION

(75) Inventor: Andreas Bergmann, Haiming (DE)

(73) Assignee: Epcos AG, Munich (DE)

( * ) Notice: Subject to any disclaimer, the term of this patent is extended or adjusted under 35 U.S.C. 154(b) by 75 days.

(21) Appl. No.: 10/812,163

(22) Filed: Mar. 29, 2004

(65) Prior Publication Data

US 2004/0246076 A1    Dec. 9, 2004

(30) Foreign Application Priority Data

Mar. 28, 2003 (DE) ............... 103 14 153

(51) Int. Cl.
  *H03N 9/64*  (2006.01)
(52) U.S. Cl. ............... 333/193; 333/195; 310/313 B; 310/313 D
(58) Field of Classification Search ........ 333/193–196; 310/313 B, 313 D
See application file for complete search history.

(56) References Cited

U.S. PATENT DOCUMENTS

| | | | | |
|---|---|---|---|---|
| 4,028,649 A | * | 6/1977 | Komatsu et al. ............ 333/194 |
| 4,081,769 A | * | 3/1978 | Shreve ........................ 333/195 |
| 4,163,465 A | | 8/1979 | Strong .......................... 144/87 |
| 4,635,008 A | | 1/1987 | Solie ........................... 333/195 |
| 4,878,036 A | * | 10/1989 | Yatsuda et al. ............. 333/195 |
| 4,910,839 A | | 3/1990 | Wright ....................... 29/25.35 |
| 4,973,875 A | | 11/1990 | Yatsuda ................... 310/313 D |
| 5,289,073 A | | 2/1994 | Mariani ................... 310/313 D |
| 6,075,426 A | | 6/2000 | Tsutsumi et al. ........... 333/193 |
| 6,856,214 B2 | * | 2/2005 | Jian et al. .................... 333/154 |

FOREIGN PATENT DOCUMENTS

| | | |
|---|---|---|
| DE | 38 38 923 | 6/1989 |
| EP | 0 850 510 | 3/2000 |
| GB | 2 212 685 | 7/1989 |

* cited by examiner

*Primary Examiner*—Barbara Summons
(74) *Attorney, Agent, or Firm*—Schiff Hardin LLP

(57) ABSTRACT

A surface acoustic wave arrangement has at least two interdigital transducers being provided on a piezoelectric substrate along an acoustic path, with at least one of the interdigital transducers being a fan transducer which is divided in a transverse direction into edge tracks and a center track. The acoustic wave excited in the edge tracks can be radiated either bidirectionally or unidirectionally in a predominant direction. On the other hand, the center track is formed so that the unidirectional radiation of the wave takes place in a direction opposite the predominant direction. In this manner, the signal transmission is suppressed in the frequency range corresponding to the finger period in the center track within the passband range of the transfer function. The obtained notch in the transfer function is used, for example, in receivers of terrestrial and satellite-based signals for suppressing the terrestrial signals in the satellite path of the receiver.

14 Claims, 12 Drawing Sheets

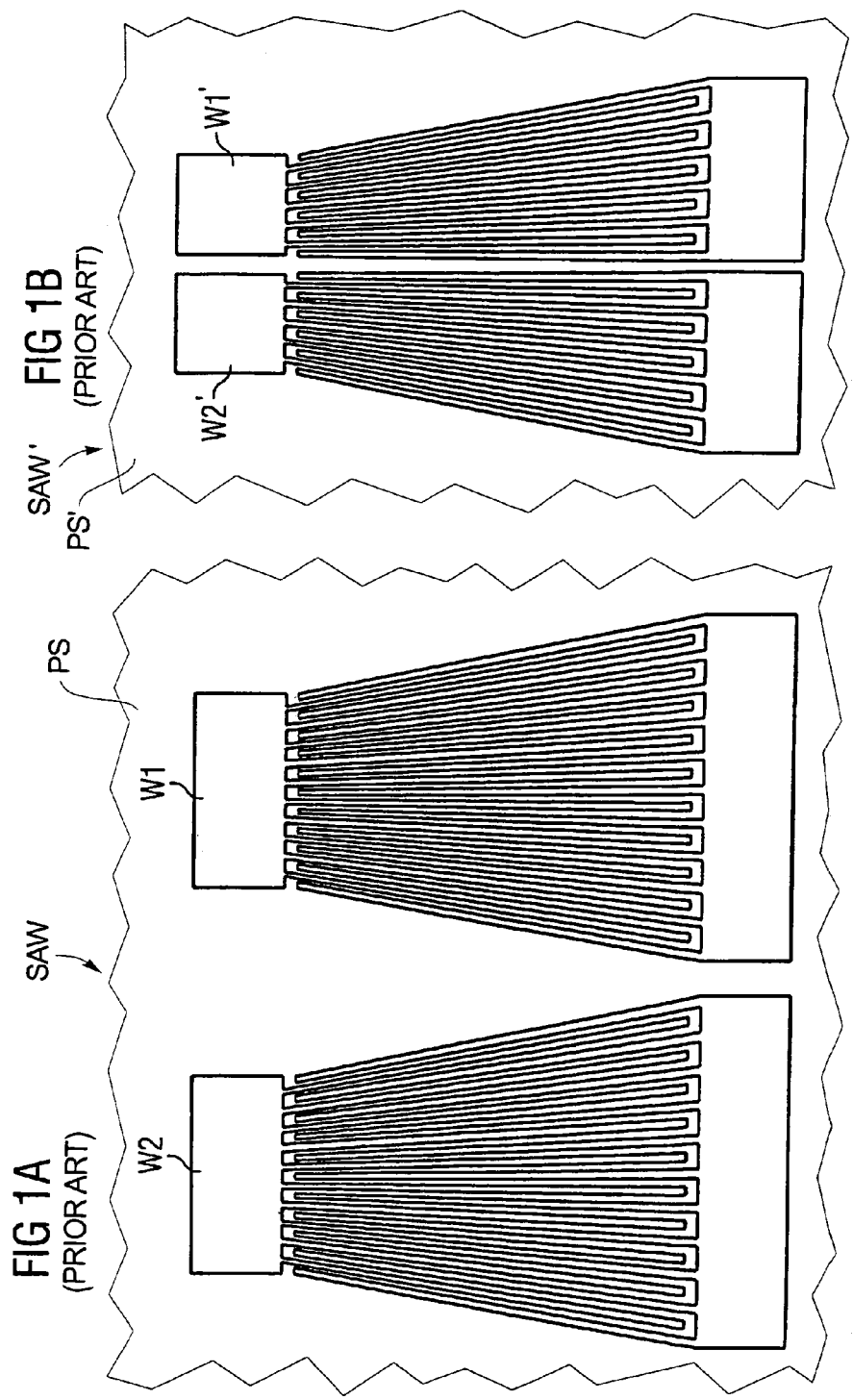

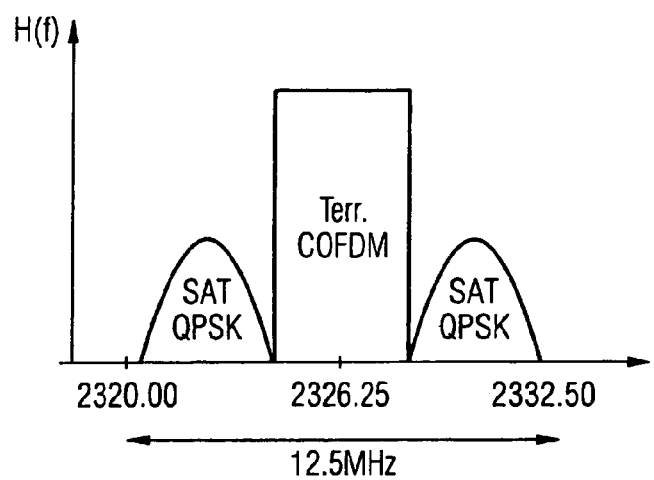
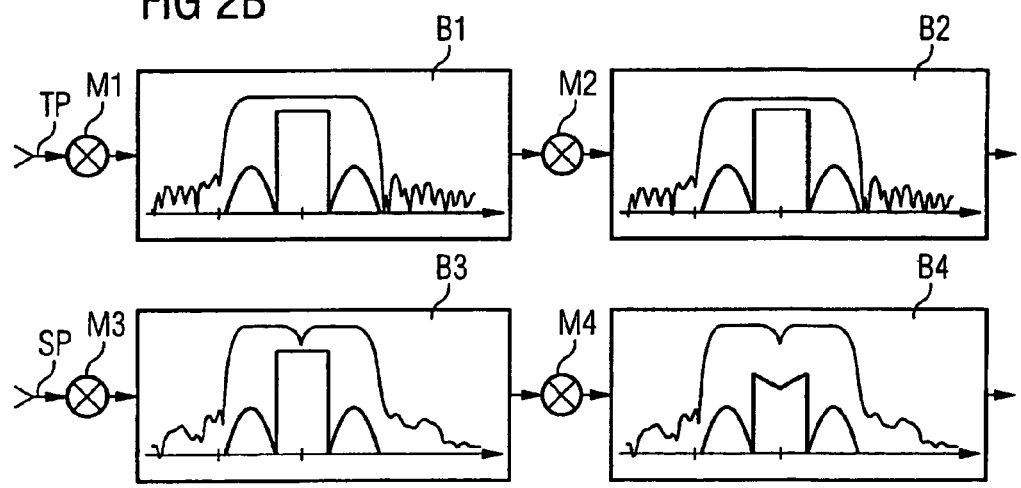

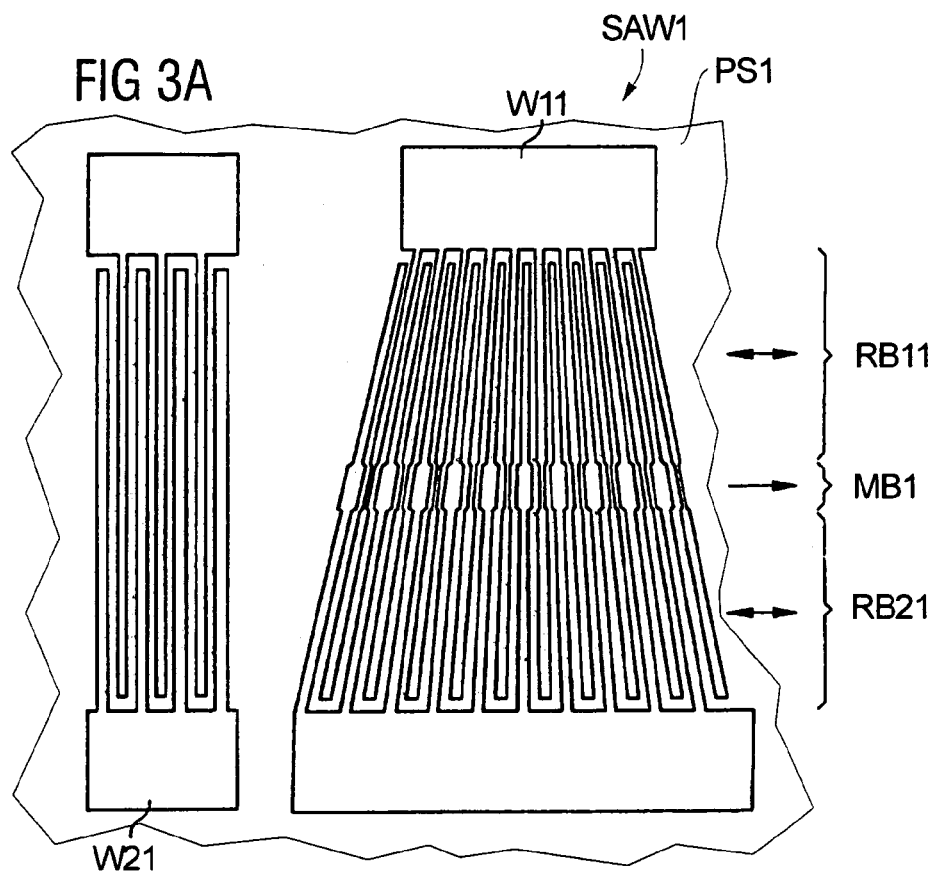
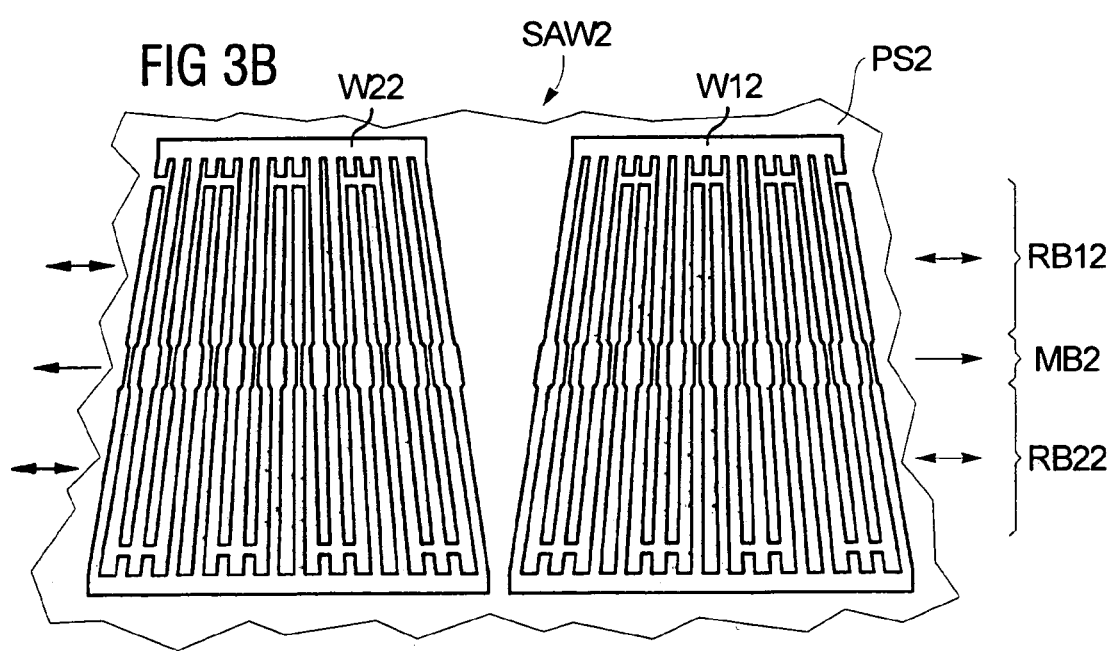

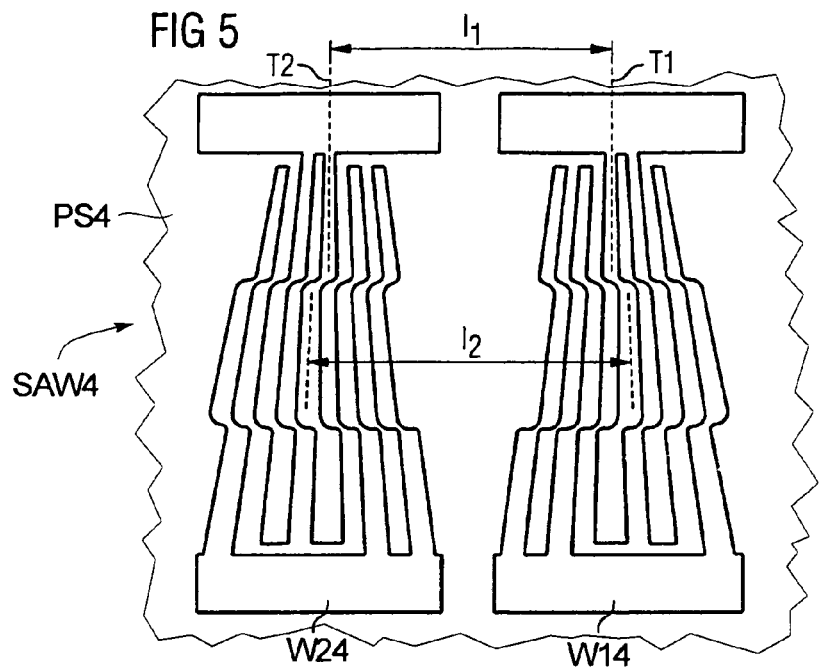
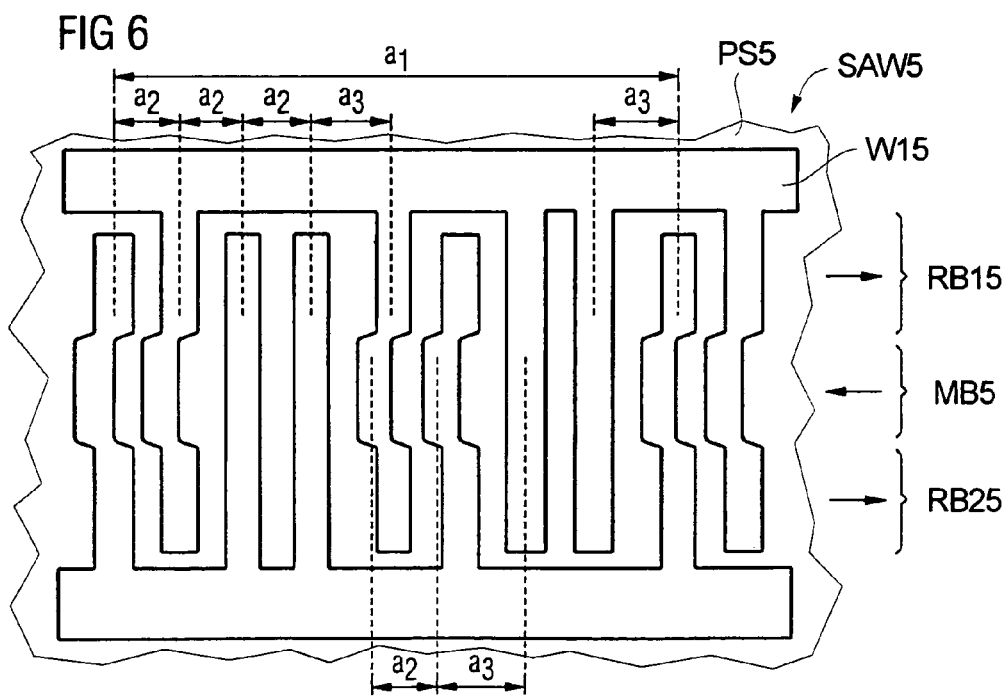

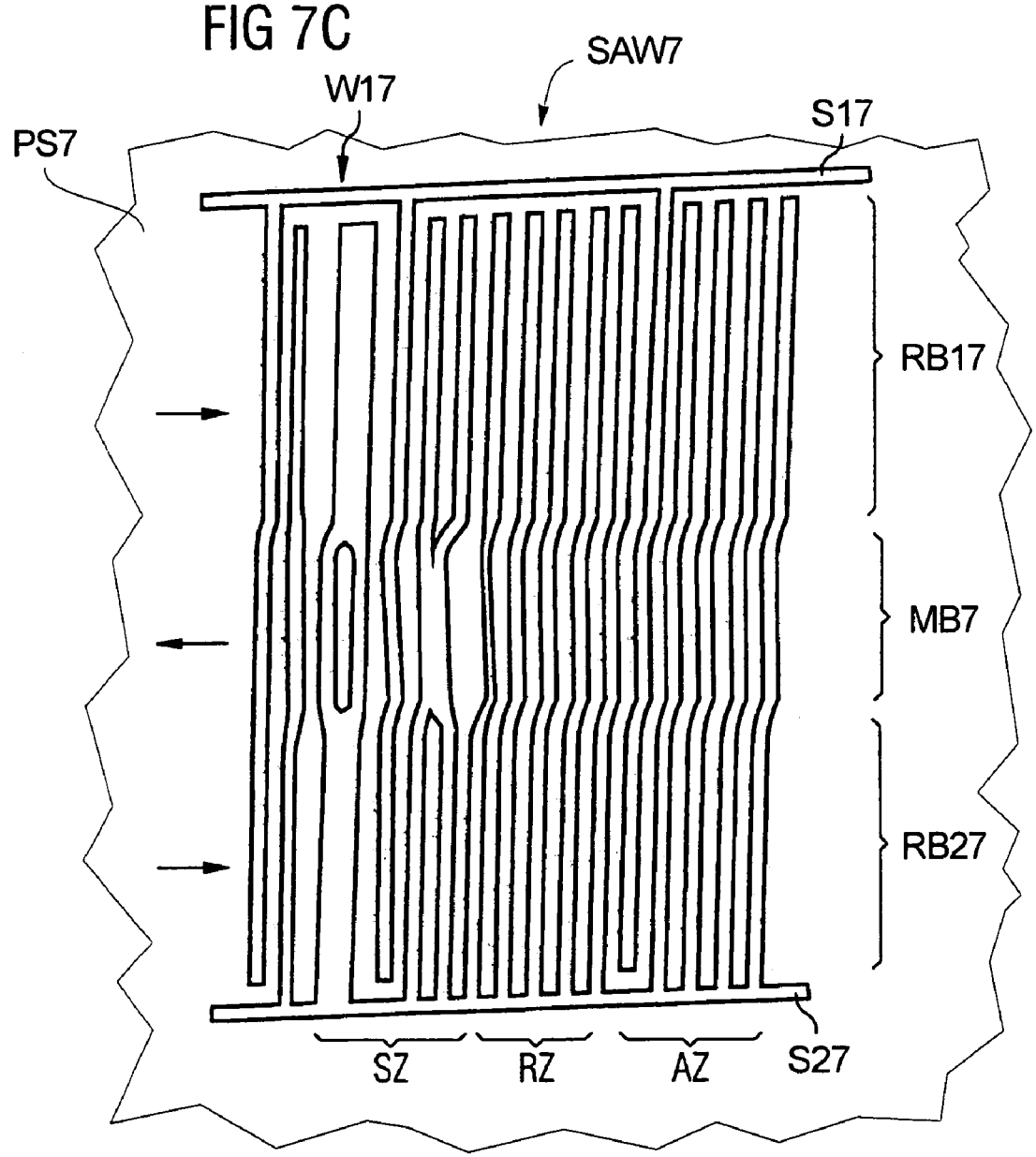

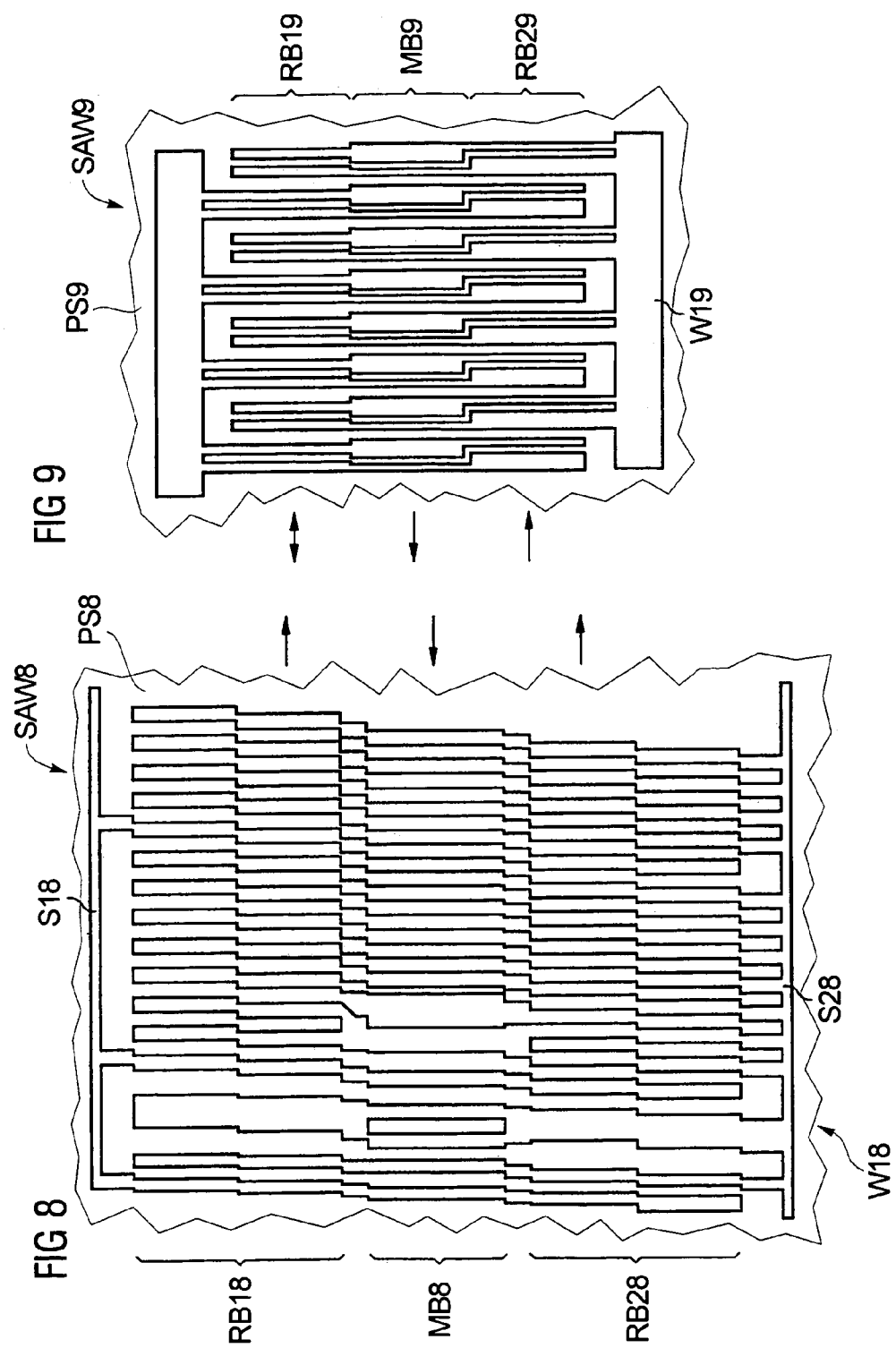

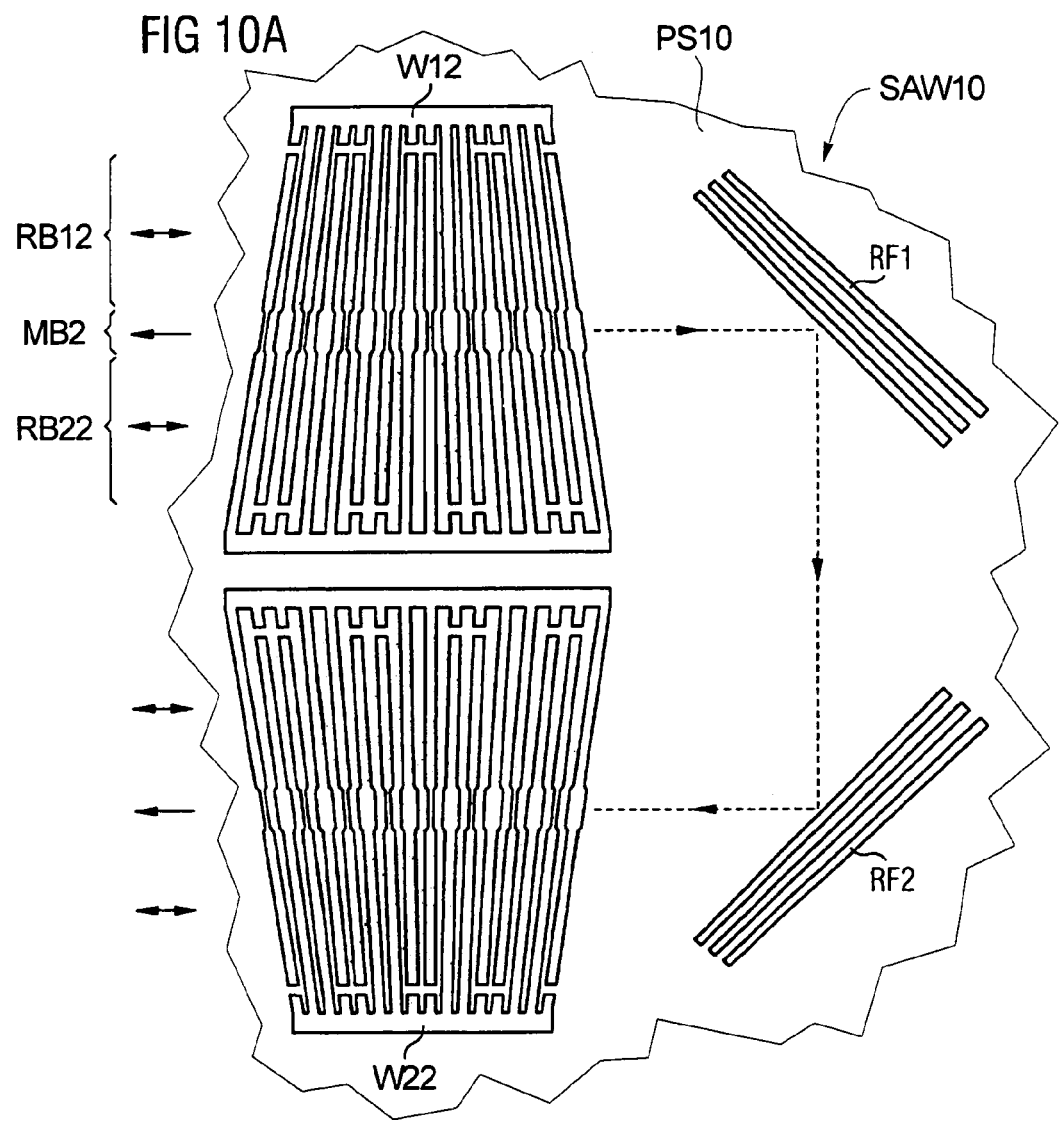

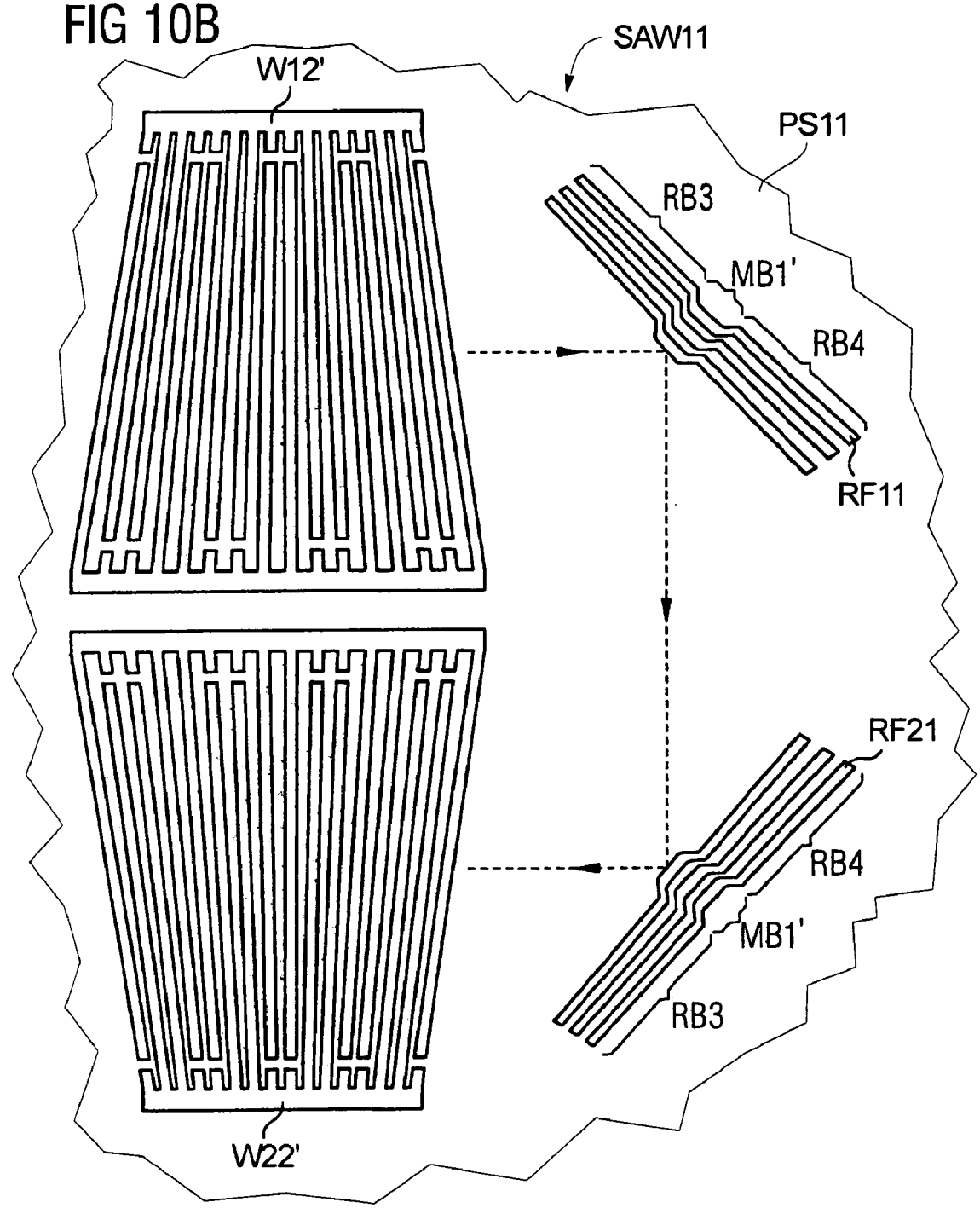

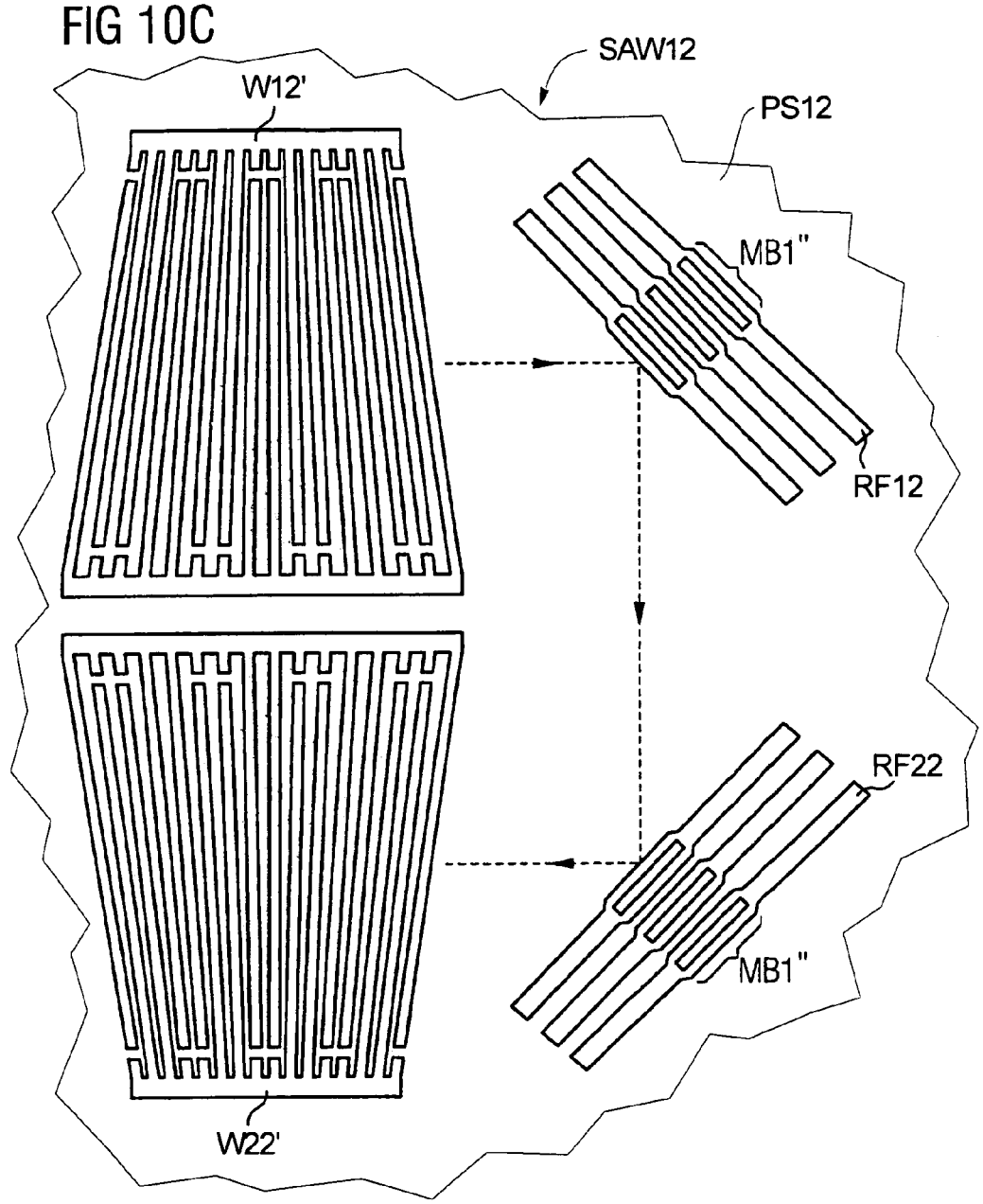

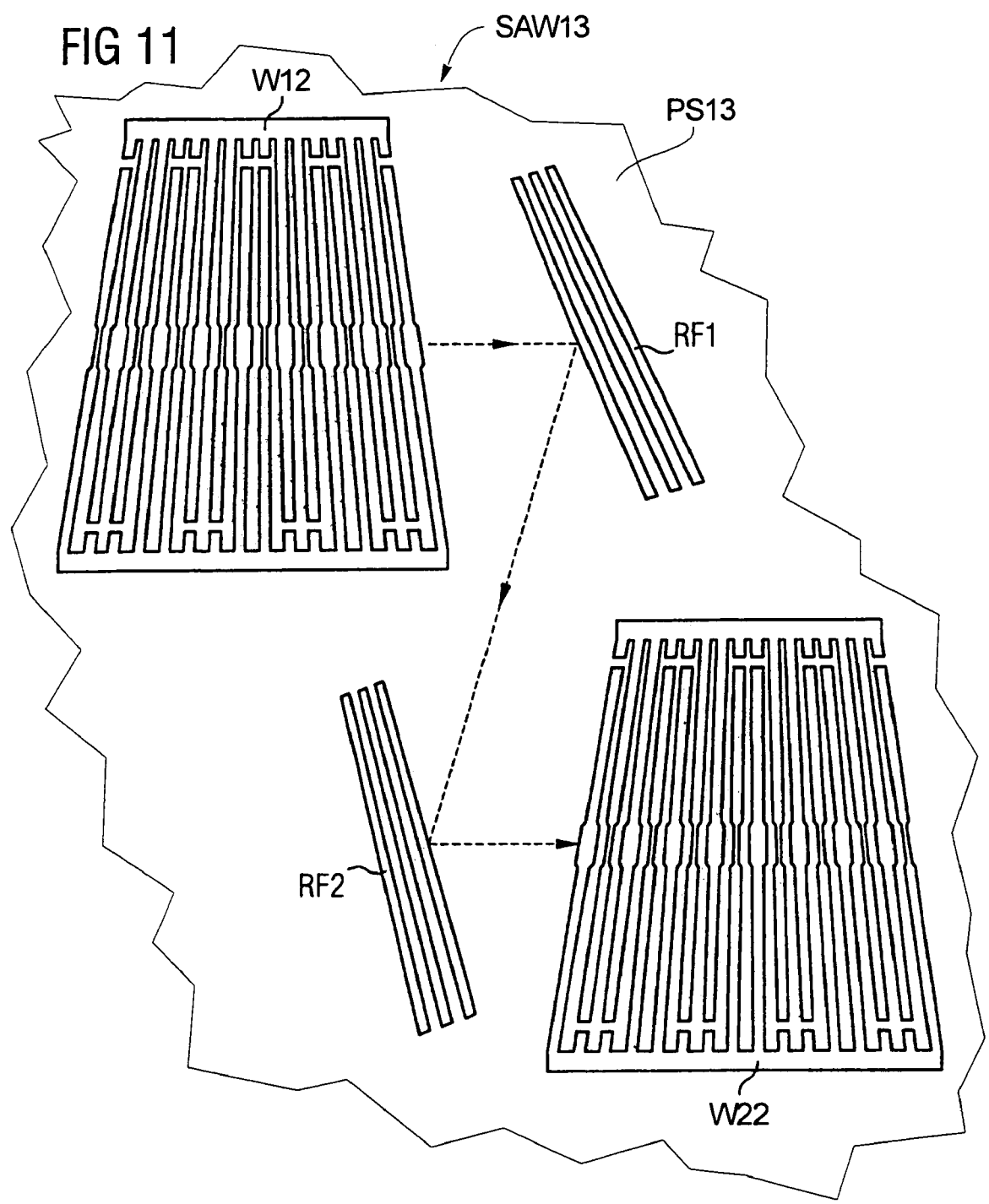

SURFACE ACOUSTIC WAVE ARRANGEMENT FOR BROADBAND SIGNAL TRANSMISSION

BACKGROUND OF THE INVENTION

The present invention is concerned with a component that functions with surface acoustic waves. Components that function with surface acoustic waves are known hereafter as SAW components. Filters based on such components are used, for example, in mobile radio devices or in reception paths of data communication systems.

An exemplary SAW component has at least one acoustic track arranged on a piezoelectric substrate, which generally contains at least one electroacoustic transducer with a preferably periodic interdigital electrode structure for exciting a surface acoustic wave, whose wavelength $\lambda$ corresponds approximately to the period of the electrode structure. The device may have two reflectors surrounding the transducer for localizing the acoustic wave in the transducer region. The surface acoustic wave excited on piezoelectric substrates, for example a Rayleigh wave, a shear wave or a longitudinal wave, has an acoustic component and an electrical component. The acoustic component of the wave is a mechanical deflection relevant to the used wave type of the material on the substrate surface. The mechanical deflection causes a corresponding electrical potential in the piezoelectric material. Thus, the surface acoustic wave takes along an electric wave component which is usually in phase with it.

The electrode structures represent mostly electrode fingers or electrode strips which are arranged interdigitally alongside one another, which have electric excitation centers if the electrode fingers arranged alongside one another of a finger pair are at a different potential. The electric excitation centers are such places in the transducer at which locally excited electric components of the electroacoustic wave going in the forward direction and one going in the backward direction are in phase together. The excitation centers are usually in the center of an electrode finger and possibly in the center of a split electrode finger.

Due to electrical and mechanical discontinuities, on each electrode finger, a part of the incident acoustic wave is reflected in the backward direction. It is assumed that the reflection is localized at a point or reflection center, at which the reflection coefficients of waves going in opposite directions are the same or rather purely imaginary. On most piezoelectric substrates which have symmetrical direction-independent characteristics in terms of reflections, this is the center of the finger.

The interdigital transducers in a SAW component are mostly bidirectional. This means that they radiate a surface acoustic wave in both longitudinal directions, for example, without a predominant direction.

For example, transducers with equidistantly arranged electrode strips of the same width, which are preferably $\lambda/4$, are known and are hereafter called normal finger transducers. Moreover, split finger transducers are known in which an electrode strip at a certain potential is split to form a split finger. In a simply split finger, for example a two-part, split finger, the electric excitation center is approximately in the center of the split.

Moreover, unidirectional interdigital transducers are also known in which, due to a special arrangement of reflectively acting electrode fingers compared to exciting electrode finger pairs, the radiation of the acoustic wave is obtained preferably in one direction, the amplitude of the wave going in a preferred direction or forward direction being significantly greater than the amplitude of the wave going in the opposite direction or backward direction.

It is possible to build unidirectional transducers on isotropic piezoelectric substrates and it is possible to achieve a preferred radiation direction of a transducer with, for example, three or four electrode fingers per wavelength. Moreover, single-phase unidirectional transducers, commonly called SPUD Ts, are known, which makes it possible to obtain the unidirectionality of the transducer with only one electrode pair per wavelength if, for example, different electrode finger widths are used. The unidirectional radiation of the acoustic wave arises in that a wave excited in the backward direction and reflected at a discontinuity point in the vicinity of the corresponding excitation center, in the forward direction, is constructively superimposed with the wave excited at the same excitation center going in the forward direction. This is achieved in a SPUDT through individual reflecting strips which are arranged in the vicinity of the exciting electrode fingers. Since the distance between the exciting and the reflecting electrode fingers is comparably large in a SPUDT, only a small bandwidth of the component can be realized. This disadvantage can be circumvented through the configuration of an interdigital transducer or converter with a period varying in the transverse direction of the electrode fingers. Here, the electrode fingers and the finger period diminish and the associated wavelength decreases, so that the measured-in-wavelengths finger center distances and the finger widths (independent of the transversal coordinates) remain constant. U.S. Pat. No. 4,973,875, whose disclosure is incorporated herein by reference thereto, and GB 2 212 685, which claims priority from the same two Japanese Patent Applications as DE 38 38 923, disclose interdigital transducers called fan transducers, such as illustrated in FIGS. 1A and 1B, by the interdigital transducers W1, W2 and W1' and W2'. A fan transducer can be divided in the transverse direction into subtracks which are discretely or continuously passing over one another and are lined up on one another, so that, in each subtrack, an acoustic wave with a specified wavelength is being excited.

Some radio broadcasters use both terrestrial and also satellite-based signal transmission for broadcasting their programs. Here, the satellite signal can be received only if a clear line of sight exists from the receiver antenna to the satellite. Otherwise, a terrestrial base station, which acts as a repeater, is used to bridge the shadowing. An exemplary frequency allocation for different signal types is shown schematically in FIG. 2A. The signal which is transmitted terrestrially is transmitted or rather received at a frequency which lies between the frequencies used for satellite-based signal transmissions.

A superheterodyne receiver shown in an exemplary manner in FIG. 2B has, in each case, a separate signal path for receiving the satellite signal (signal path SP) and the terrestrially transmitted signal (signal path TP). The received signal is mixed down to a center frequency or in steps using mixers M1–M4 in each case to a lower frequency, for example 315 MHz and subsequently to 75 MHz in Sirus Radio. After each mixer, a bandpass filter B1–B4 is provided. Broadband SAW filters, for example fan transducer arrangements, are particularly well suited for this application.

Due to strong power level differences between terrestrial and satellite-based signals, undesired interference to the two signal types can occur, under certain circumstances, in the receiver. In order to decrease this effect, the range around the center frequency of the filter should be suppressed by using notched filters. Here, the transfer range for satellite-based signals should ideally not be disturbed.

It is possible in a fan transducer to suppress the signal transmission, which is caused through excitation of an acoustic wave, at certain fingers in the passband by reducing the overlap length of the electrode fingers of the subtrack formed for excitation of the acoustic wave at this frequency. This solution has the disadvantage that for long transducers, the angle of the terminal fingers deviates highly from the normal to the wave propagation direction, it is also true that the increase in the fan angle in the corresponding subtrack would lead to an overlapping of the adjacent fingers. For the shortened overall length of the transducer, the excitation strength of the transducer is decreased.

Moreover, it is possible to apply a dampening mass on the subtrack, which excites the signals to be suppressed. However, this requires a precision which cannot be implemented currently with previously known techniques, such as screen printing.

Another possibility consists of arranging dampening structures or structures for diverting the acoustic wave between the input and output transducer, but this is difficult to implement due to the limited chip length.

Moreover, there exists the possibility to replace the transducers in each case with two subtransducers in order to suppress the corresponding frequency band in the center of the passband range. If the subtransducers are connected in parallel, there arises additional connecting structure which cannot always be connected directly to further components arranged on the same substrate of the filter circuit and which increases the electromagnetic crosstalk of the parts of the circuit. A series connection of the subtransducers has the disadvantage that here the impedance of the arrangement is quadrupled.

SUMMARY OF THE INVENTION

The underlying object of the present invention is to provide a SAW arrangement, particularly a broadband SAW bandpass filter, which provides, with a simple design, a particularly good suppression of frequency band within the passband of the arrangement.

This object is achieved by a surface acoustic wave arrangement which comprises a piezoelectric substrate, a first interdigital transducer and a second interdigital transducer being arranged in an acoustic path that can be either longitudinally oriented or singularly or multiply bent using reflectors, the absolute finger center distance or the finger center distance and finger width of the first interdigital transducer decreases in the transverse direction, the acoustic path is divided in the transverse direction into two edge tracks and a center track arranged between the edge tracks, the radiation of the acoustic wave in the edge tracks of the first interdigital transducer takes place upon excitation bidirectionally or following the acoustic path, preferably in the predominant direction. The interdigital transducer of at least one of the reflectors is modified in the center track, so that the radiation of the acoustic wave takes place preferably in a direction opposite the predominant direction or the acoustic waves excited and/or diverted in the center track and in the edge tracks go essentially with the opposite phase.

The invention specifies a SAW arrangement with the following features: On a piezoelectric substrate, a first interdigital transducer and a second interdigital transducer are arranged in the acoustic path that is longitudinally oriented or singly or multiply bent using reflectors. The absolute finger center distance and the absolute finger width of the first interdigital transducer increases or decreases in the transverse direction essentially monotonically or in steps. The acoustic path is divided in the transverse direction into two edge tracks and a center track arranged between the edge tracks. In the edge tracks of the first interdigital transducer, the finger center distance or the finger center distance and the finger width are selected so that the radiation of the acoustic wave can take place bidirectionally or following the acoustic path preferably in a predominant direction.

In a preferred embodiment of the invention, the finger widths and/or the finger center distances in the center track of the first interdigital transducer are selected so that the radiation of the acoustic wave takes place preferably in a direction opposite the predominant direction. Alternatively, the electrode fingers in the center track of the first interdigital transducer and/or of the second interdigital transducer in the longitudinal direction are offset relative to one another, so that the acoustic waves excited in the center track and the in the edge tracks run essentially with the opposite phase.

Moreover, in an acoustic path that is multiply bent using reflectors that include reflector strips, a first interdigital transducer and a second interdigital transducer can be arranged with the period of the reflector strips corresponding essentially to the center frequency of the interdigital transducer. In the first interdigital transducer, the finger center distance or the finger center distance and the finger width are chosen so that the radiation of the acoustic wave takes place bidirectionally or following the acoustic path, preferably in a predominant direction. Here, it can be provided alternatively according to the invention as a modification of the center track of the first interdigital transducer that the reflectors are divided in the direction along reflector strips into two reflector edge tracks and a reflector center track arranged between the reflector edge tracks, the reflector strips being split in the reflector center track and the subfingers formed in this manner having preferably a width of $\lambda/8$ and being spaced from one another by $\lambda/8$. Alternatively, to split the electrode fingers in this embodiment of the invention, the reflector strips in the reflector center track can be offset in the longitudinal direction with respect to the strips in the reflector edge tracks, the acoustic waves diverted by the reflector center track and the edge track of the last reflector in the predominant direction running essentially with the opposite phase.

The absolute finger center distance of the first interdigital transducer can vary, either by being decreased or being increased, in the transverse direction from track to track or within a track selected from the center track and the edge tracks, in the edge regions monotonically or stepwise.

The electrode fingers taper in the transverse direction, preferably so that the ratio of the finger center distance and the finger width in the transverse direction remains constant.

Also in the second interdigital transducer, the finger center distance or the finger center distance and the finger width can decrease or increase in the transverse direction. The second interdigital transducer can be formed with a center track essentially like the first interdigital transducer.

The electrode fingers of the first and second interdigital transducer in the center track can form single phase unidirectional transducer or SPUDT cells in the longitudinal direction, whose length is equal to a wavelength $\lambda$ or an integral multiple of the wavelength. The electrode fingers of the first and second interdigital transducer can have, within a SPUDT cell, to some extent, different layer thicknesses and/or finger widths and/or finger center distances. The SPUDT cells can be formed so that in the first and second interdigital transducers, pairs of adjacently arranged electrode fingers are connected to the same current rail, and the electrode fingers of a pair have, in the longitudinal direction in the center track, different widths. As a result of this, the radiation of an acoustic wave takes place in the direction opposite the predominant direction. The electrode finger pairs formed in this manner alternate, for example, with an electrode finger connected to the other current rail or an electrode finger pair which consists of electrode fingers with the same or different widths.

The acoustic path is limited, preferably by two reflectors.

Other advantages and features of the invention will be readily apparent from the following description of the preferred embodiments, the drawings and claims.

BRIEF DESCRIPTION OF THE DRAWINGS

FIGS. 1A and 1B are schematic plan views of known SAW arrangements having two interdigital transducers;

FIG. 2A is a graph illustrating frequency allocations for combined terrestrial and satellite-based signal transmission;

FIG. 2B is a schematic diagram of a receiver with a path for receiving terrestrial signals and a path for receiving satellite-based signals;

FIG. 3A is a schematic plan view of a SAW arrangement according to the invention with a fan transducer with bidirectionally radiating edge tracks and SPUDT cells formed in the center track;

FIG. 3B is a schematic plan view of a SAW arrangement according to the invention with two fan transducers, with bidirectional edge tracks and SPUDT cells formed in the center track;

FIG. 5 is a schematic plan view of a SAW arrangement according to the invention with two bidirectional fan transducers and electrode fingers that are offset in the center track in the longitudinal direction;

FIG. 6 is a schematic plan view of a unidirectional fan transducer according to the invention with opposite transducer directivity in the center track;

FIG. 7C is a schematic plan view of a fan transducer according to the present invention with broadband unidirectionally radiating edge tracks and a narrow band opposite unidirectionally radiating center.track;

FIG. 8 is a schematic plan view of a fan transducer according to the invention with a stepwise varying finger center distance with unidirectionally radiating edge tracks and an opposite unidirectionally radiating center track;

FIG. 9 is a schematic plan view of another fan transducer according to the present invention with a bidirectionally radiating upper edge track, a unidirectionally radiating lower edge track and an opposite unidirectionally radiating center track;

FIG. 10A is a schematic plan view of a SAW arrangement according to the invention having two interdigital transducers with a bent acoustic path;

FIG. 10B is a schematic plan view of a modification of the SAW arrangement according to the present invention of two interdigital transducers with a bent acoustic path;

FIG. 10C is a schematic plan view of yet another embodiment of a SAW arrangement according to the present invention of two interdigital transducers with a bent acoustic path; and FIG. 11 is a schematic plan view of a still further SAW arrangement according to the present invention having two interdigital transducers with a bent acoustic path therebetween.

DESCRIPTION OF THE PREFERRED EMBODIMENTS

Figure 4A:
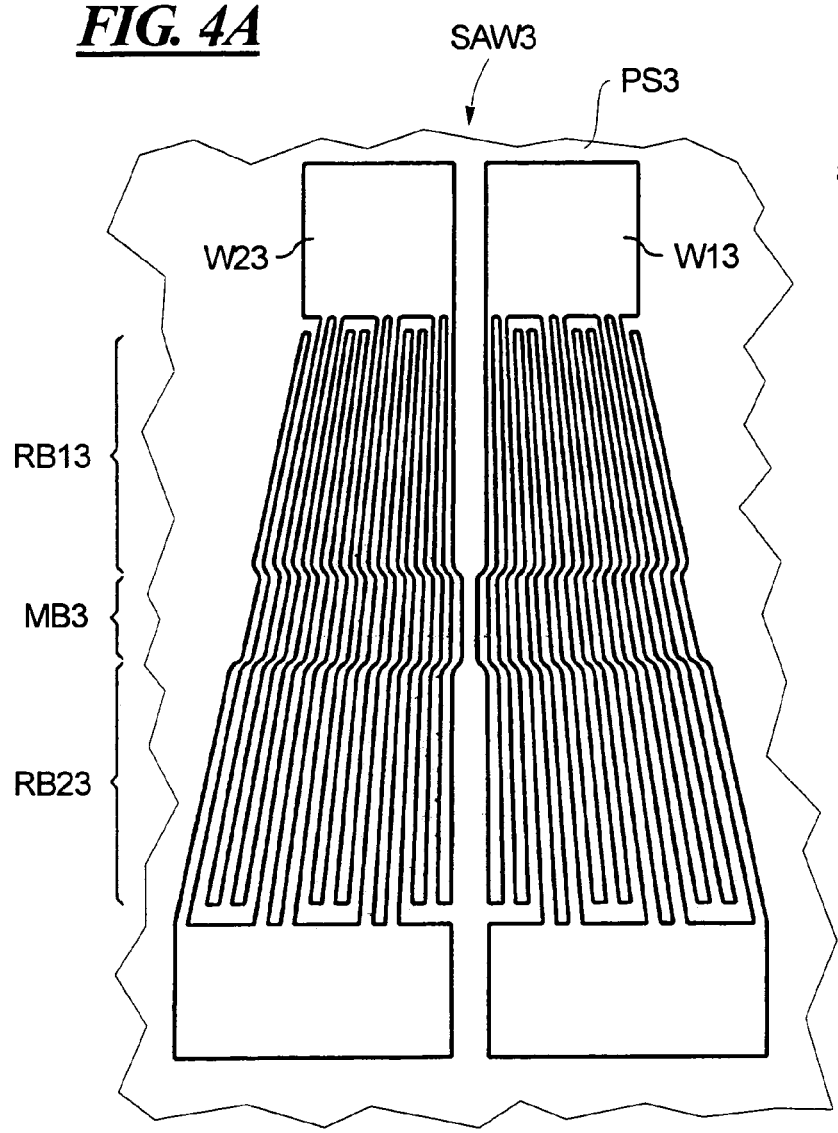
FIG. 4A is a plan view of two bidirectional fan transducers having electrode fingers that are offset in the center track in the longitudinal direction.

FIG. 1A shows a known surface acoustic wave arrangement SAW having two interdigital transducers W1 and W2 formed as fan transducers on a portion of a piezoelectric substrate PS. The electrode fingers are arranged on a periodic grid, the period of the grid and, thus, the absolute finger center distances decrease in the selected transverse direction, which is illustrated as in the upward direction. The electrode fingers taper in this direction so that the finger widths measured in wavelengths or rather the finger center distances measured in wavelengths remains constant, but the wavelength decreases with decreasing absolute finger center distances.

The transducer arrangement shown in FIG. 1A is also known as a dual-focus arrangement, since the electrode fingers of the two transducers W1 and W2 lengthened in the transverse direction converge in each case at a point or focus point.

In FIG. 1B, another known arrangement SAW' is a single focused arrangement of two fan transducers, which are shown with the electrode fingers of the two transducers W1' and W2' lengthened in the transverse direction and converging at a single point. The transducers are formed on a surface of a piezoelectric substrate PS'.

FIG. 2A shows a frequency allocation for combined terrestrial and satellite-based signal transmission. The terrestrial transmission is encoded using coded orthogonal frequency division multiplexing or COFDM, while the satellite-based transmission is encoded using a quadrature phase shift key or QPSK. The terrestrially transmitted signal is transmitted or rather received at a frequency which lies between the frequencies used for the satellite-based signal transmission.

FIG. 2B diagrammatically shows the two-stage superheterodyne receiver which is suitable for reception of both terrestrial signals, in a signal path TP, as well as satellite-based signals, in a signal path SP. The signal path TP has a first mixer M1 followed by a bandpass filter B1 followed by a second mixer M2, followed by a second bandpass filter B2. The satellite-based signals SP have a path with a first mixer M3 followed by a bandpass filter B3, followed by a second mixer M4 followed by a bandpass filter B4. The bandpass filters B1–B4 are SAW bandpass filters and the SAW bandpass filters B3 and B4 arranged in the satellite path SP have, in each case, a notch in the passband of the transfer function, so that the terrestrial signal is suppressed.

FIG. 3A shows a surface acoustic wave arrangement SAW1 according to the present invention with a first interdigital transducer W11 formed as a fan transducer and a second interdigital transducer W21 formed as a normal finger transducer. The two transducers W11 and W21 are formed on a surface of a piezoelectric substrate PS1. The second interdigital transducer W21 is preferably a broadband transducer and, thus, has a low length. The finger period of the second interdigital transducer corresponds to the center frequency of the filter. The first interdigital transducer W11 has means to divide the acoustic path into edge tracks RB11 and RB21 with a center track MB1 being arranged therebetween. In the edge tracks RB11 and RB21, the electrode fingers taper in the transverse direction upward and, simultaneously, the absolute finger period in this direction decreases monotonically. The finger widths and finger center distances measured in the wavelengths or rather their ratio remain constant in the transverse direction. The edge tracks RB 11 and RB21 of the first interdigital transducer W11 are formed so that, upon the electric excitation, a bidirectional radiation of the acoustic wave occurs. The electrode fingers lying adjacent one another in the center track MB1 have their widths alternately increased or reduced, so that in the center track per wavelength λ, two electrode fingers with different widths are formed, which form the SPUDT cells lined up alongside one another in the longitudinal direction. The acoustic wave excited in the center track MB1 is preferably radiated opposite the predominant direction. The responding radiation directions are shown schematically in FIG. 3A by the arrows.

Another SAW arrangement, SAW2, is illustrated in FIG. 3B and has two interdigital transducers W12 and W22 formed as fan transducers on a surface of a piezoelectric substrate PS2. The electrode fingers of the transducers are split in order to cancel acoustic reflections occurring internally in the transducers. The finger width and the minimum distance between the fingers in the edge tracks RB12 and RB22 are preferably the same and equal to λ/8. By avoiding internal reflections in the fan transducer, a symmetrical passband is achieved.

The two interdigital transducers W12 and W22 are formed in the center track, essentially like the first interdigital transducer W11 in FIG. 3A. Enlarged and thin regions of the split electrode fingers alternate in the longitudinal direction, and the excited acoustic wave is radiated unidirectionally in a direction opposite the predominant direction, as indicated by the arrows.

The transducer arrangement shown in FIG. 3B is what is known as a dual-focus arrangement, because the imaginary extensions of the electrode fingers of each transducer converge at a point or focus point which does not agree or coincide with the focus point of the other transducer.

Figure 4B:
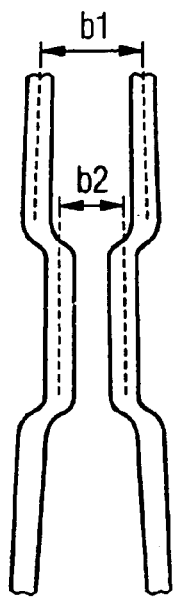
FIG. 4B is an enlarged view of a pair of fingers showing center offset.

In FIG. 4A, another transducer arrangement SAW3 according to the invention is illustrated schematically. In this transducer arrangement, two transducers W13 and W23 are schematically illustrated as being formed on a surface of a piezoelectric substrate PS3. An imaginary extension of the electrode fingers of the two transducers W13 and W23 converge at a point or focus point. A center distance bi (see FIG. 4B), which is related to the edge tracks RB13 and RB23 and measured in wavelengths of the wave excited at the respective transverse location between electrode fingers turned toward one another of the two transducers, remains constant in the transverse direction.

The acoustic waves excited in the edge tracks RB13 and RB23 and also in a center track MB3 are radiated bidirectionally in this embodiment. The means to divide the acoustic path into tracks has the electrode fingers being offset in the center track MB3 in the longitudinal direction relative to the position of the electrode fingers in the edge tracks. This offset $|b_2-b_1|$ measured in wavelengths is equal to a half wavelength. In the center track, an acoustic wave is excited which runs with an opposite phase compared to the waves excited in the edge tracks and cancels them in the frequency range corresponding to the center track.

An arrangement, generally indicated at SAW4, has a pair of transducers W14 and W24 formed on the surface of a piezoelectric substrate PS4 and is illustrated schematically in FIG. 5. In this illustration, the offset of the electrode fingers in the center track is carried out according to the invention and is a dual-focus arrangement of the transducers W14 and W24. A transverse axis T1, T2, which is the symmetry axis, can be allocated to each of the transducers W14 and W24. The axes of the transducers can be oriented with respect to one another, i.e., parallel to one another, at a distance of $l_1$ or also tilted with respect to one another, so that the desired transfer function of the arrangement occurs. The position of the electrode fingers in the center track is then offset compared to their position in the edge tracks, so that the offset $|l_2-l_1|$ measured in wavelengths, which refers to the wavelength corresponding to the center track, is equal to a half wavelength.

In FIG. 6, an arrangement SAW5 has a transducer W15 formed on a surface of a piezoelectric substrate PS5. The transducer W15 is an interdigital fan transducer which, for purposes of illustration, has the fingers being substantially parallel instead of having a changing pitch, such as the fingers in the transducers such as W14 in FIG. 5. The transducer W15 has edge tracks RB15 and RB25 radiating unidirectionally in the predominant direction to a center track MB5 radiating in the opposite direction unidirectionally for the interdigital transducer. The interdigital transducer W15, as mentioned above, is a fan transducer with electrode fingers having a uniform finger width.

The length of a basic cell (a SPUDT cell) included in this embodiment is eight electrode fingers, which is equal to an integral multiple n of the wavelength, for example 3λ. It is also possible to have a number m of electrode fingers arranged in a cell of the length nλ. In this case, the finger center distance in a bidirectionally radiating cell of this type is equal to exactly nλ/m.

The electrode fingers form a basic cell of a length $a_1$ and have eight fingers per basic cell. For the edge tracks RB15 and RB25, there are two groups of four fingers, with approximately uniform finger center distance $a_2$, and these two groups are separated by a center distance $a_3$, which is illustrated in FIG. 6 as between the fourth and fifth fingers starting with the first finger on the left. In the middle or center track MB5, four of the eight fingers have an offset center with the distance between the pair of offset fingers being $a_2$ but the distance from the offset portion of the second finger of each group from the third finger is $a_3$. The connection sequence known per se of electrode fingers with differently chosen values of $a_2$ and $a_3$ causes the edge tracks RB15 and RB25 to have the radiation of the acoustic wave preferably in a predominant direction to the right, as indicated by the arrows. The groups of four of the electrode fingers are chosen according to the invention in the center track MB5 by offsetting the electrode fingers so that the radiation of the wave is attained in the opposite direction, as indicated by the arrow.

In a further embodiment of the invention, the distances $a_2$ and $a_3$ are chosen to be equal in the edge track, so that the edge tracks radiate bidirectionally.

Figure 7A:
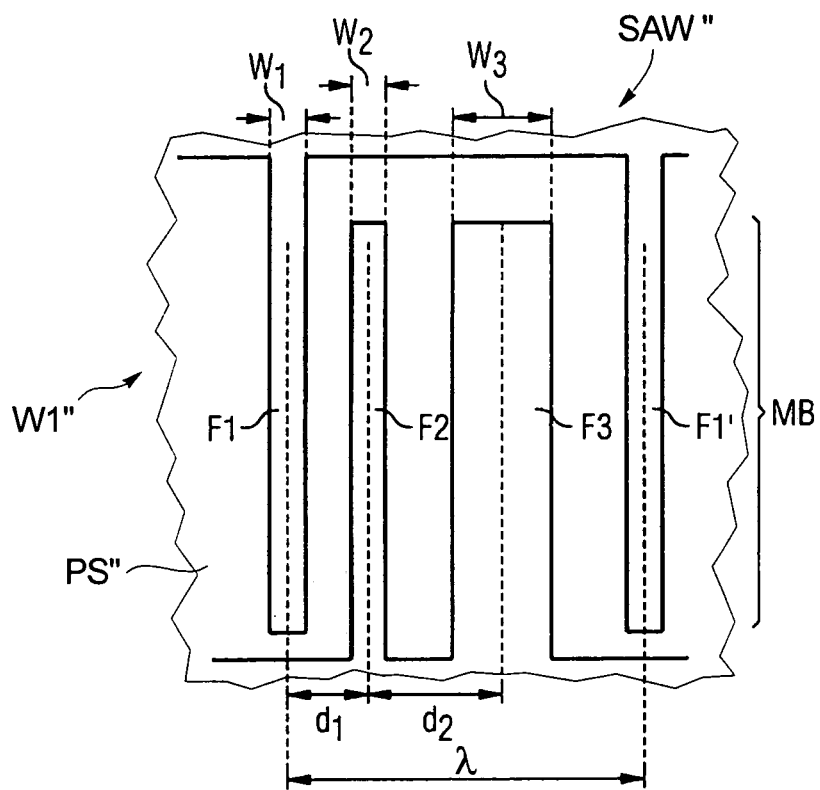
FIG. 7A is a schematic plan view of a basic structure of a known SPUDT cell which is used, for example, in a unidirectional fan transducer.

FIG. 7A shows a known arrangement SAW", which has a fan transducer W1" formed on a piezoelectric substrate PS". As with the previous embodiment of FIG. 6, the fan transducer is illustrated with parallel-extending fingers for purposes of illustration instead of the fingers having a variable pitch. For the center track MB, this known transducer has a first electrode finger F1 which is connected to a first current rail and has a finger width W1. A second electrode finger F2 having a finger width $W_2$ and a third electrode finger F3 having a finger width $W_3$ are connected to a second current rail. Here, the third electrode finger F3 acts reflectively, while the electrode fingers F1 and F2 arranged alongside one another serve to excite the acoustic wave. The center distance $d_1$, between the first and second fingers is preferably equal to $\lambda/4$. The center distance $d_2$ between the second and the third fingers is preferably equal to the center distance between the third finger F3 and a first finger F1' of the next SPUDT cell and is equal to $3\lambda/8$. In this manner, within a cell, a relative displacement of $\lambda/8$ is achieved between an excitation center and a reflection center. The following modifications of this SPUDT cell are known:

1) Distributed acoustical reflection transducer cell or DART cell, where $W_3=3\lambda/8$;
2) Electrode width controlled cell according to Lewis, where $W_3=\lambda/4$; and
3) SPUDT cell according to Fliegel, where $W_1=W_2=W_3$.

According to the invention, basically all of the types of SPUDT cells named here or also further types can be used to design the center track in order to obtain the unidirectional radiation in the direction opposite the predominant direction.

Figure 7B:
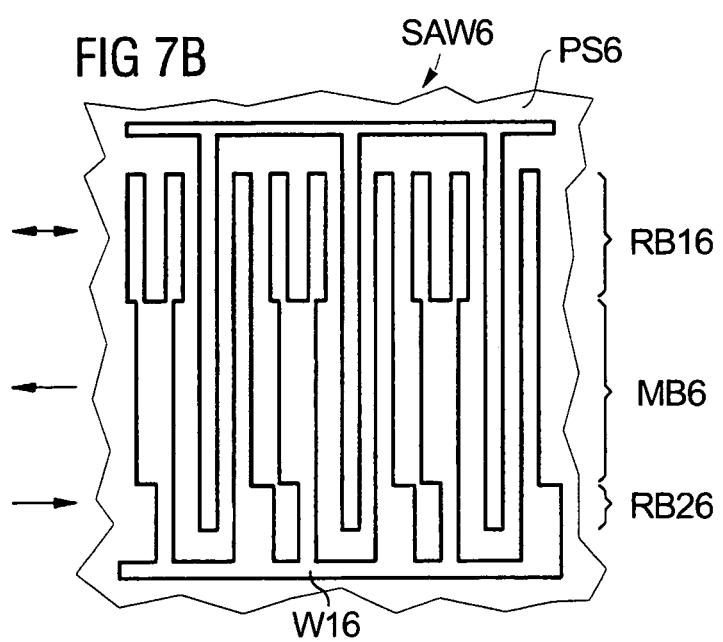
FIG. 7B is a schematic plan view of a fan transducer according to the invention with a bidirectionally radiating upper edge track, a unidirectionally radiating lower edge track and an opposite unidirectionally radiating center track.

In FIG. 7B, an arrangement SAW6, which has a transducer W16 formed on a surface of a piezoelectric substrate PS6 is illustrated. The transducer W16 is a fan transducer but, for purposes of illustration, the pitch has not been illustrated. The transducer W16 has edge tracks RB16 and RB26, which, according to the invention, radiate differently, as shown, for example, in that the edge track RB16 radiates bidirectionally while the edge track RB26 radiates unidirectionally in a predominant direction to the right, as indicated by the arrows. The electrode fingers in the center track MB6 and in the edge track RB26 are divided here in the longitudinal direction into SPUDT cells. The radiation directions in the center track MB6 and the edge track RB26 are opposed to one another but are unidirectional. The SPUDT cells are formed in this embodiment of the invention corresponding to the structure of FIG. 7A, wherein the finger portion in each of the tracks has different widths with the relationship of the finger portions in the center track MB6 going from left to right being wide, thin, thin, wide, thin, thin, wide, whereas the relationship in the edge tracks RB26 is thin, thin, wide, thin, thin, wide.

A similarly functioning interdigital transducer W19, which is formed as a fan transducer on a surface of a piezoelectric substrate PS9 is shown in the arrangement SAW9 in FIG. 9. While the fan transducer W19 is not shown with a changing pitch, it is provided with another SPUDT cell type, for example a SPUDT cell according to Hanma and Hunsinger, with the center track MB9 and the edge track RB29 as shown in FIG. 9. The split finger exhibits, in the center track MB9 and also in the edge track RB29 provide alternate compressing and spreading and excite radiation unidirectionally in directions opposite to one another. As illustrated in FIG. 9, the fingers have different widths, with the widths from left to right going thin, wide, thin, wide, thin, wide, thin, wide for the center track MB9 and being wide, thin, wide, thin for the edge track RB29.

It is possible in all embodiments of the invention that the orientation or rather tilt and the interconnected degree of tapering of the electrode fingers is chosen differently from track to track or also within a track, selected out of the edge tracks and the center track. Thus, the overlapping region of the electrode fingers can be controlled for selected frequencies and, thus, the excitation strength for certain frequencies. In particular, it is possible that the electrode finger in the center track, as shown in FIG. 7C, are oriented parallel to one another and preferably perpendicular to the wave propagation direction. Here, a particularly deep notch is obtained in a narrow frequency range within the passband.

In the embodiment shown in FIG. 7C, an arrangement SAW7 has a transducer W17 formed on a surface of a piezoelectric substrate PS7. The basic cells line up in the center track MB7 or in the edge tracks RB17 and RB27 and are formed differently as SPUDT cells SZ, bidirectionally radiating cells AZ or reflecting cells RZ. The SPUDT cells in each case are formed by a "hot" electrode finger connected to a current rail S17 and two "cold" electrode fingers or rather split electrode fingers connected to another current rails S27. Through suitable arrangement of the unsplit electrode fingers relative to the "hot" electrode fingers within a SPUDT cell, the radiation of the acoustic wave is achieved in the edge tracks RB17 and RB27 and the center track MB7 in the predominant directions with the direction in the center track opposite the direction in the edge tracks, as indicated by the arrows.

In FIG. 8, an arrangement SAW8 has a transducer W18 formed on a surface of a piezoelectric substrate PS8. The transducer W18 is a fan transducer, but does not show the pitch of the fingers for purposes of illustration. The transducer W18 has finger periods that decrease in the transverse direction in steps or rather electrode fingers that taper in steps. The stepwise change in the electrode fingers takes place not only at the transition from one track to another, but also within a track, for example within an edge track RB18 and RB28. It is also possible for the center track MB8 to have one or more steps with the same or a different lengths, so that overlapping lengths in an exciting finger pair will be present. The connection sequence of the electrodes and the relative arrangement of different basic cells corresponds to the variation of the invention as illustrated in FIG. 7C that was previously explained.

FIG. 10A shows another development of a SAW arrangement, such as SAW10, which has transducers W12 and W22 formed on the surface of a piezoelectric substrate PS10 along with two reflectors RF1 and RF2 to form a multiply bent acoustic path between the first interdigital transducer W12 and the second interdigital transducer W22. As illustrated, the acoustic wave excited in the edge tracks RB12 and RB22 of the first interdigital transducer W12 are bidirectionally radiated and are deflected by the reflectors RF1 and RF2 in the direction of the second interdigital transducer W22. The center track of the two transducers W12 and W22 are formed so that the acoustic wave is radiated unidirectionally opposite the predominant direction, as shown by the arrows.

The reflectors RF1 and RF2 are reflector strips which can be electrically interconnected or insulated from one another.

In FIG. 10B, an arrangement SAW11 is provided with interdigital transducers W12' and W22' being formed on the surface of a piezoelectric substrate PS11 along with reflectors RF11 and RF21. The two transducers W12' and W22' are developed without a center track and are provided for this corresponding reflector center tracks MB I' formed by offset portions of the reflector strips in the reflectors RF11 and RF21. Thus, the means for dividing the acoustic path are the reflectors RF11 and RF21. The wave deflected by the reflector center tracks and arriving at the second interdigital transducer W22' goes with an opposite phase compared to the wave deflected by the reflector edge tracks RB3 and RB4, so that the two waves mutually cancel each other.

It is also possible, instead of the offset of the position of the reflector strips in the reflector center track MB1' to split the reflector fingers, as suggested in FIG. 10C. In FIG. 10C, an arrangement SAW12 has the two transducers W12' and W22' along with the two reflectors RF12 and RF22 formed on the piezoelectric substrate PS12. The reflectors RF12 and RF22 have a center reflecting track MB1' formed by a split portion and, thus, the deflection of the wave is suppressed in the frequency range corresponding to the reflector center track MB1'.

In another embodiment, it is possible to offset the portions of the electrode fingers in the center track of the interdigital transducers, as shown by the arrangement of FIG. 5, instead of the portions of the reflector strips.

FIG. 11 shows another SAW arrangement SAW13, which has the transducers W12 and W22 along with reflectors RF1 and RF2 arranged on a piezoelectric substrate PS13. In this arrangement, the reflectors are such that the bent acoustic path has a Z-shape instead of the U-shape, such as illustrated in FIGS. 10A–10C. The transducers W12 and W22 are formed like the transducers in FIG. 3B.

All transducers in the arrangements according to the present invention are realized as unidirectional transducers and it is possible to distribute the electrode fingers having excitation centers and/or reflector strips or rather the structures arranged within a transducer and suitable for reflection of the acoustic wave in each case differently spatially. A spatial distribution of this sort of the structures or weighting is characterized using a weighting function. The weighting function of the exciting electrode fingers can match the weighting function of the reflecting strips. However, it is also possible for the named weighting functions to differ from one another. It is possible that the weighting function of the exciting electrode fingers provides an omission of some electrode fingers. For example, a weighting is also possible through series connections of different transducer parts both along an acoustic track and also in the direction perpendicular to this track. In the latter case, the transducer parts of the transducers arranged in different tracks are connected to one another (partially) serially (series weighting). Moreover, the weighting of the width and/or the position of the electrode fingers is possible. A combination of the weightings named here in a weighting function is also provided according to the invention.

It is possible to form the edge tracks with unidirectional radiation of excited acoustic waves in a direction opposite the predominant direction, the center track being formed so that the acoustic wave excited in the center track is radiated bidirectionally.

For the sake of clarity, the invention has been presented only using a few embodiments, but it is not limited to those or to certain frequency range. Further possible variations result in particular with regard to the number and possible combinations of the basic elements presented above is within the scope of this invention.

I claim:

1. A surface acoustic wave arrangement comprising a piezoelectric substrate; a first interdigital transducer and a second interdigital transducer being arranged along an acoustic path on the piezoelectric substrate; said first interdigital transducer having fingers with absolute finger center distances and finger widths, one of the absolute finger center distances and a combination of the absolute finger center distances and finger widths decreasing in the transverse direction for the first interdigital transducer; means dividing the acoustic path in the transverse direction into two edge tracks and a center track arranged between the edge tracks, the fingers of the first interdigital transducer being constructed so that the radiation of the acoustic wave in the edge tracks being selected from a bidirectional excitation and an excitation in a predominant direction, said means modifying the center track, so that the radiation of the acoustic wave takes place as a radiation selected from a radiation in a direction opposite the predominant direction and a radiation with an opposite phase.

2. An arrangement according to claim 1, wherein the first interdigital transducer has fingers with one of the finger center distances and the combination of finger widths and the finger center distances for one of the center track, the edge tracks and combinations of an edge and center tracks varying in the longitudinal direction.

3. An arrangement according to claim 1, wherein one of the finger widths and the finger center distances in the center track of the first interdigital transducer are chosen so that the radiation of the acoustic wave takes place preferably in a direction opposite the predominant direction and wherein the electrode fingers in the center track of the first digital transducer and the second interdigital transducers in the longitudinal direction are offset relative to one another so that the acoustic waves excited in the center track and in the edge tracks run essentially with the opposite phase.

4. An arrangement according to claim 1, wherein the absolute finger center distance of the first interdigital transducer decreases monotonically in a transverse direction either from track to track or within a track, which is selected from a center track and the edge tracks.

5. An arrangement according to claim 1, wherein the absolute finger center distance of the first interdigital transducer decreases stepwise in a transverse direction either from track to track or within a track, which is selected from a center track and the edge tracks.

6. An arrangement according to claim 1, wherein the electrode fingers taper in the transverse direction, so that the ratio of the finger center distances and the finger widths in the transverse direction remains constant.

7. An arrangement according to claim 1, wherein the second interdigital transducer has fingers with a finger center distance and finger width, and one of the finger center distances and a combination of the finger center distances and finger widths decrease in the transverse direction.

8. An arrangement according to claim 7, wherein the second interdigital transducer is formed with a center track essentially like the first interdigital transducer.

9. An arrangement according to claim 1, which includes two acoustic reflectors disposed on the surface of the piezoelectric substrate, said reflectors being arranged to limit the acoustic path.

10. An arrangement according to claim 1, wherein the electrode fingers of one of the first and second interdigital transducers in the center track form a single phase unidirectional transducer cell in the longitudinal direction having a length which is equal to an integral multiple of the wavelength $\lambda$.

11. An arrangement according to claim 10, in which electrode fingers of one of the first and second interdigital transducers having within a single phase unidirectional transducer cell to some extent have one of different layer thicknesses, different finger widths and different finger center distances and combinations thereof.

12. An arrangement according to claim 10, wherein one of the first and second interdigital transducers has pairs of adjacently arranged electrode fingers being connected to the same current rail, the electrode fingers of the pair having, in the longitudinal direction in the center track, different widths, so that the radiation of the acoustic wave takes place preferably in the direction opposite the predominant direction.

13. An arrangement according to claim 1, which includes reflectors being disposed on the substrate to provide multiple bends in the acoustic path, each reflector including reflector strips, the period of the reflector strips corresponding essentially to the center frequency of the arrangement, said means for forming a center track and edge tracks having the reflectors being divided in a direction along the reflector strips into two reflector edge tracks and a reflector center track arranged between the reflector edge tracks, the first interdigital transducer having one of the finger center transducer distances and combinations of the finger center distance and finger width chosen so that the radiation of the acoustic wave is selected from bidirectional radiation and radiation following the acoustic path preferably in the predominant direction, the reflector strips having a structure selected from being split in the reflector center track and reflector strips in the reflector center track being offset in the longitudinal direction with respect to the strips in the reflector edge tracks, the acoustic waves diverted by the reflector center track and the reflector edge tracks of a last reflector in the predominant direction going essentially with opposite phases.

14. An arrangement according to claim 1, which includes at least one reflector for bending the acoustic path, the means dividing the acoustic path into two edge tracks and a center track being a structure selected from the finger structure of the first interdigital transducer and the structure of the at least one reflector.

* * * * *